United States Patent [19]

Edmond et al.

[11] Patent Number: 4,947,218
[45] Date of Patent: Aug. 7, 1990

[54] P-N JUNCTION DIODES IN SILICON CARBIDE

[75] Inventors: John A. Edmond, Apex; Robert F. Davis, Raleigh, both of N.C.

[73] Assignee: North Carolina State University, Raleigh, N.C.

[21] Appl. No.: 116,446

[22] Filed: Nov. 3, 1987

[51] Int. Cl.$^5$ ............................................. H01L 29/90
[52] U.S. Cl. ...................................... 357/13; 357/56; 357/61; 357/63; 357/67; 357/52; 437/100; 437/192; 437/193
[58] Field of Search ........................ 357/56, 13, 61, 63, 357/67 S, 52, 52 C; 437/40, 41, 100, 192, 193, 200, 233, 946, DIG. 148

[56] References Cited

U.S. PATENT DOCUMENTS

| | | | |
|---|---|---|---|
| 2,918,396 | 12/1959 | Hall | 357/61 X |
| 2,937,323 | 5/1960 | Kroko et al. | 317/234 |
| 2,937,324 | 5/1960 | Kroko | 317/234 |
| 3,063,876 | 11/1962 | Le May et al. | 148/1.5 |
| 3,082,126 | 3/1963 | Chang | 148/1.5 |
| 3,124,454 | 3/1964 | Berman | 75/177 |
| 3,176,204 | 3/1965 | Taylor | 317/237 |
| 3,254,280 | 5/1966 | Wallace | 357/33 X |
| 3,308,356 | 3/1967 | Rutz | 317/237 |
| 3,340,110 | 9/1967 | Grabmaier et al. | 148/175 |
| 3,377,210 | 3/1968 | Somerville et al. | 148/1.5 |
| 3,396,059 | 8/1968 | Glammanco | 148/171 |
| 3,649,384 | 3/1972 | Kamath | 148/171 |
| 3,662,458 | 5/1972 | Formigoni et al. | 357/61 X |
| 3,663,722 | 5/1972 | Kamath | 148/171 |
| 3,669,763 | 6/1972 | Perusek | 148/171 |
| 4,639,761 | 1/1987 | Singer et al. | 357/13 X |
| 4,757,028 | 7/1988 | Kondoh et al. | 437/100 X |
| 4,762,806 | 8/1988 | Suzuki et al. | 437/100 |

FOREIGN PATENT DOCUMENTS

| | | | |
|---|---|---|---|
| 615175 | 2/1961 | Canada . | |
| 1956011 | 10/1969 | Fed. Rep. of Germany . | |
| 50-57784 | 5/1975 | Japan . | |
| 55-546506 | 4/1980 | Japan | 357/56 |
| 58-538860 | 3/1983 | Japan | 357/13 |
| 60-226173 | 11/1985 | Japan | 357/13 |

OTHER PUBLICATIONS

Marsh et al., "Ion–Inplanted Junctions and Conducting Layers in SiC," *Radiation Effects*, 1970, vol. 6, pp. 301–311.
Suzuki et al, "High–Temperature Characteristics of CVD Grown β–SiC P–N Junction Diodes," *Amended Abstracts of the* 18th (1986 Int'l) *Conf. on Solid State Devices and Materials*, Tokyo, 1986, pp. 101–104.
Kalinina et al, "Structure and Properties of Ion–Implantation–Dopes P–N Junctions in SiC," *Sov. Phys. Semicond.*, 14(6), Jun. 1980, pp. 652–654.
Furukawa et al, "3C–SiC P–N Junction Diodes," *Appl. Phys. Lett.*, vol. 48, No. 22, 1986, pp. 1616–1617.
Edmond et al, "Electrical Properties of Ion Implanted P–N Junction Diodes in β–SiC," Dept. of Materials, Science and Engineering, NCSU, Raleigh, N.C.
Shibahara et al, "Inversion–Type MOS Field Effect Transistors Using CVD Grown Cubic SiConSi," *Jap. J. Appl. Phys.*, 23, L863 (1984).
Malik et al, "Planar Doped Barriers in GaAs by Molecular Beam Epitaxy," *Electronics Letters*, 23 Oct. 1980, vol. 16, No. 22, pp. 836–837.
Electrical Properties of Ion Implanted P–N Junction Diodes in B-SiC; Edmond et al; Dept. of Materials, Science and Engineering, NCSU, Raleigh, N.C.
3C-SiC p–n Junction Diodes; Furukawa et al; Appl. Phys. Lett., vol. 48, No. 22, 1986, pp. 1616–1617.

*Primary Examiner*—William Mintel
*Attorney, Agent, or Firm*—Bell, Seltzer, Park & Gibson

[57] ABSTRACT

The invention comprises a method of forming a diode which is operable at high temperature, at high power levels, and under conditions of high radiation density. The method comprises bombarding a region of a substrate of doped silicon carbide having a first conductivity type with high temperature ion implantation of doping ions into the substrate to give the bombarded region an opposite conductivity type. Regions of opposite conductivity type adjacent one another and a respective p-n junction are thereby formed. Ohmic contacts are added to the substrate and to the bombarded region to complete the diode.

8 Claims, 3 Drawing Sheets

P-N JUNCTION DIODES IN SILICON CARBIDE

FIELD OF THE INVENTION

The present invention relates to the production of p-n junctions and resulting diodes, and in particular relates to the production of p-n junction diodes in silicon carbide using high temperature ion implantation.

BACKGROUND

Silicon carbide has been a perennial candidate for use in the manufacture of semiconductor electronic devices. Silicon carbide has a number of characteristics which make it theoretically advantageous for such uses. These include a wide band gap, a high thermal conductivity, a low dielectric constant, a high saturated electron drift velocity, a high breakdown electric field, and a high melting point. Taken together, these properties indicate that semiconductor devices formed from silicon carbide should be operable at much higher temperatures than devices made from other semiconductors, as well as at higher speeds at higher power levels, and with an increased device density.

Nevertheless, semiconductor electronic devices made from silicon carbide have yet to make a viable appearance in any circumstances other than laboratory research and have yet to reach their commercial potential. This lack of success results, at least partially, from the difficulty encountered in working with silicon carbide. It is an extremely hard material, often used as an abrasive. It often must be worked at extremely high temperatures under which other materials cannot be worked, and from a semiconductor standpoint, crystallizes in well over 150 polytypes, many of which are separated by rather small thermodynamic differences. For these latter reasons, production of monocrystalline thin films of silicon carbide that are necessary for certain devices and production of large single crystals of silicon carbide which are useful for other applications, has remained an elusive goal. Additionally, certain doping techniques which have been successfully developed for other materials have proved unsuccessful when used in connection with silicon carbide. In particular, the successful use of ion implantation techniques has, until recently, remained unachieved.

Recently, however, a number of developments have occurred which have successfully accomplished both single crystal and thin film growth of silicon carbide, as well as successful ion implantation techniques. These are included in several copending patent applications which have been assigned to the assignee of the present invention, and the contents of which are incorporated herein by reference. These include: Davis, et al., "Growth of Beta-SiC Thin Films and Semiconductor Devices Fabricated Thereon", Ser. No. 113,921, filed Oct. 26, 1987 now U.S. Pat. No. α,912,063; Davis et al., "Homoepitaxial Growth of Alpha-SiC Thin Films and Semiconductor Devices Fabricated Thereon," Ser. No. 113,573, filed Oct. 26, 1987 now U.S. Pat. No. 4,912,064; Davis et al., "Sublimation of Silicon Carbide to Produce Device Quality Single Crystals of Silicon Carbide," Ser. No. 113,565, filed Oct. 26, 1987; and Edmond et al., "Implantation and Electrical Activation of Dopants Into Monocrystalline Silicon Carbide," Ser. No. 113,561, filed Oct. 26, 1987 now U.S. Pat. No. 4,866,055.

The success of these techniques has made possible improved techniques for producing p-n junctions and junction diodes in silicon carbide.

As is known to those familiar with electronic devices, the production of p-n junctions is a fundamental step in both characterizing a semiconductor material and in fabricating other junction devices such as diodes, transistors and the like. Accordingly, given the theoretical advantages of silicon carbide and the necessity of producing junctions to develop devices, there has been significant interest in methods of producing such junctions in silicon carbide. Most of these efforts, however, have not attempted to use ion implantation techniques, but instead have developed methods of producing what may be referred to as "fused" junctions. In such junctions, alternating regions of p-type and n-type silicon carbide are formed in contact with one another to form the p-n junction. Typical techniques have included melting a dopant metal directly on the surface of silicon carbide so that some of the dopant dissolves into the silicon carbide to produce an oppositely doped region, the border of which forms the p-n junction. Others use separately formed portions of p-type and n-type silicon carbide and fuse them to one another using various processes to form the p-n junction. Yet another technique is to form an epitaxial growth of p or n-type silicon carbide upon a substrate of silicon carbide having the opposite conductivity type. Finally, there are a number of other methods such as the various solvent based techniques.

Less interest and very little success have occurred where ion implantation techniques have been attempted upon silicon carbide. Ion implantation is a doping technique in which the desired impurities (dopants) are introduced into the semiconductor lattice by bombarding the surface with high energy dopant ions. This technique offers more control over dopant levels and locations than most of the other doping techniques.

Kalinina et al, *Electrical Prooerties of P-N Junctions Formed By Ion Implantation In N-Type SiC.* Sov. Phys. Semicond. 12, 1372 (1978), discuss ion implantation of silicon carbide aluminum ions at room temperatures, followed by annealing at about 1800° C. Marsh and Dunlap, *Ion-Implanted Junctions and Conducting Layers in SiC,* Radiation Effects 1970, Vol. 6, p. 301, discuss ion implantation in silicon carbide to produce junctions and diodes in which nitrogen, phosphorous, antimony, and bismuth were all implanted at room temperature, and in which antimony was additionally implanted at 500° C., all to produce n-type conductivity. Similarly, boron, aluminum, gallium, and thallium were implanted at room temperature in an attempt to obtain p-type conductivity. According to Marsh, however, the only successful results were in producing donor (n-type) implanted materials and Marsh admits "little or no success in creating p-type SiC . . . using implant and anneal procedures similar to those used for the n-type dopants."

Accordingly, there presently exists no successful technique for ion implantation of both donor and acceptor dopant ions into monocrystalline silicon carbide which results in appropriately electrically activated n and p-type materials.

Therefore, it is an object of the present invention to provide a method of forming a diode operable at high temperatures, high power levels and under conditions of high radiation density which comprises forming a region of monocrystalline, electrically activated doped silicon carbide having a first conductivity type on a substrate of monocrystalline doped silicon carbide having the opposite conductivity type by high temperature ion implantation of doping ions into the doped silicon carbide substrate which give the ion implanted region the first conductivity type.

It is another object of this invention to successfully form a region of monocrystalline, electrically activated, p-type silicon carbide on a substrate of monocrystalline doped silicon carbide having an n-type conductivity type.

It is a further object of the invention to provide a method of forming a diode having a region of monocrystalline, electrically activated doped silicon carbide having a p-type conductivity on a substrate of monocrystalline doped silicon carbide having an n-type conductivity by high temperature ion implantation of group III doping ions into the doped silicon carbide substrate.

It is another object of the invention to provide a planar diode operable at high temperatures, high power levels and under conditions of high radiation density in which the diode comprises a portion of silicon carbide having a first conductivity type, a portion of more heavily doped silicon carbide having the opposite conductivity type immediately adjacent the portion of first conductivity type and respective ohmic contacts on each of the respective portions of silicon carbide.

It is a further object of the invention to provide a mesa diode operable at high temperatures, high power levels and under conditions of high radiation density in which diode comprises a portion of silicon carbide having a first conductivity type, a portion of more heavily doped silicon carbide having the opposite conductivity type positioned upon the first portion of silicon carbide, and respective ohmic contacts to the respective portions of silicon carbide.

It is another object of the invention to provide a planar diode which comprises a doped silicon carbide substrate having a first conductivity type, a doped well of silicon carbide in said silicon carbide substrate, said doped well having the opposite conductivity type from said doped silicon carbide substrate, an insulation layer on the silicon carbide substrate surface and positioned over the p-n junction between the well and the substrate at the surface, and a conductor positioned upon the insulation layer directly above the p-n junction between the well and the substrate for permitting a potential to be applied directly above the p-n junction to thereby confine the depletion zone from expanding in a direction parallel to the surface of the diode.

The foregoing objects and other advantages of the invention will be set forth more clearly in the detailed description, taken in conjunction with the accompanying drawings and wherein

SUMMARY OF THE INVENTION

The present invention comprises a method of forming diodes operable at high temperatures, under conditions of high radiation density, and at high speeds at high power levels, the method comprising forming a region of monocrystalline electrically activated doped silicon carbide having a first conductivity type on a substrate of monocrystalline doped silicon carbide having the opposite conductivity type by high temperature ion implantation of doping ions into the silicon carbide substrate which give the ion implanted region the first conductivity type. High temperature implantation of aluminum or nitrogen resulted in p or n-type characteristics, respectively, in beta silicon carbide thin films, and diode characteristics were studied as a function of temperature using current-voltage and capacitance-voltage measurements. In both cases, rectification was observed to the highest measurement temperatures tested, 673K. The capacitance voltage measurements indicated that both types of diodes were abrupt junctions.

DETAILED DESCRIPTION

As stated earlier herein, certain techniques used in producing the diode of the present invention have been thoroughly described in other applications, the contents of which have been incorporated herein by reference. In addition to the necessary growth of both alpha and beta thin films in which diodes can be produced, a fundamental technique for producing the diodes of the present invention is described in the patent application "Implantation and Electrical Activation of Dopants into Monocrystalline Silicon Carbide," referred to earlier. In this particular implantation technique, the silicon carbide substrate being bombarded is maintained at an elevated temperature, e.g. between 600K and 1100K. At this temperature, very little damage to the crystal lattice appears to take place, and the introduced dopants can be satisfactorily electrically activated by annealing the implanted material at a relatively moderate temperature, e.g. 1400–1500K. Where a passivated surface is desired, the step of heating the surface in oxygen to form a silicon dioxide passivating surface can also sufficiently activate the dopants so that further annealing is not always required.

Figure 1:
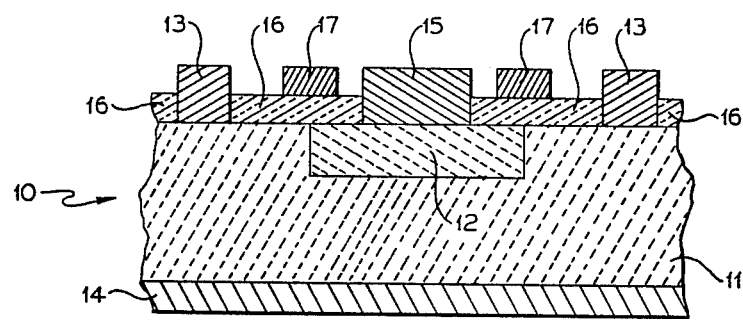
FIG. 1 is a cross-sectional view of a planar diode according to the present invention.

FIG. 1 illustrates a cross-sectional view of a planar diode formed according to the method of the present invention and generally designated at 10. The diode is formed of a substrate 11 having a first conductivity type which can be produced as an epitaxial growth and doped in-situ. A well 12 of opposite conductivity type is implanted into the substrate 11 by the high temperature ion implantation technique described above. As will be understood by those familiar with the manufacture of such devices, such a well can only be formed by ion implantation and a diode as illustrated in FIG. 1 can accordingly only be produced according to the present invention.

Given the structure of the planar diode of FIG. 1, the ohmic contacts to the substrate can be positioned either on the front 13 or back side 14 of the diode 10. A similar ohmic contact 15 can be made to the well. A passivating layer 16, typically formed of silicon dioxide is positioned on the surface of the diode having the p-n junctions, and where desired, conducting gate material 17 can be added to the passivating layer 16 such that a potential applied to the gate material will assist in focusing the active region of the diode, preventing it from substantially expanding in a direction parallel to the surface of the diode.

Expressed differently, if the surface of the diode is defined as falling in an x-y plane, the depletion region will extend in the z-direction. The gate material helps confine the active region and prevents it from substantially expanding in directions other than the z-direction.

The specific planar diode of FIG. 1 can also be formed so that the well portion 12 is formed of more heavily doped silicon carbide whenever such additional doping is either desired or required.

Figure 2:
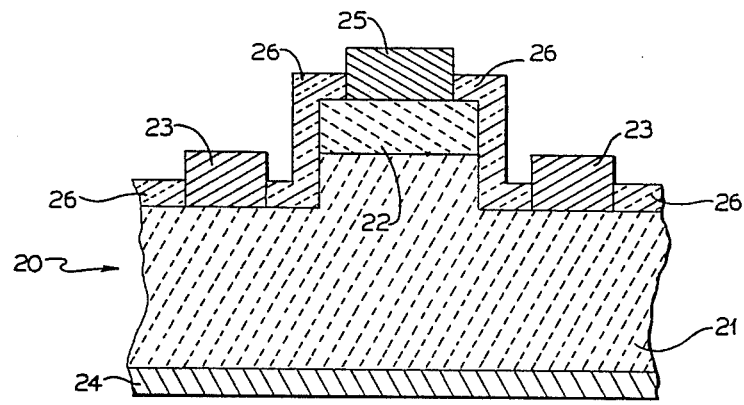
FIG. 2 is a cross-sectional view of a mesa diode according to the present invention.

FIG. 2 illustrates another embodiment of the invention, which is a mesa diode generally designated at 20. The mesa diode similarly includes a substrate portion of 21 of silicon carbide having a first conductivity type upon which is positioned a portion of silicon carbide 22 having the opposite conductivity type so that the p-n junction is formed between the substrate 21 and the portion 22. As illustrated in FIG. 2, portion 22 is an epitaxial layer of doped silicon carbide upon the substrate 21. In order to define the active region, the remainder of the epitaxial layer which forms the oppositely doped portion 22 along with a portion of the substrate 21 have been removed, for example by reactive ion etching. A description of a successful technique for reactive ion etching of silicon carbide using plasmas formed from nitrogen trifluoride is set forth in copending patent application "Dry Etching of Silicon Carbide," Ser. No. 07/116,467, filed Nov. 3, 1987, now U.S. Pat. No. 4,865,685, issued Sept. 12, 1989, which is assigned to the common assignee of the present invention and which is incorporated herein by reference.

As in the planar diode of FIG. 1, the mesa diode of FIG. 2 can include ohmic contacts to either the front 23 or back side 24 of the substrate 21. Another ohmic contact 25 is positioned upon the portion 22 and a passivating layer of material 26 can also be included, again typically formed of silicon dioxide.

In carrying out the present invention, thin films (10–20 microns) of monocrystalline beta silicon carbide (100) were epitaxially grown on Si(100) via chemical vapor deposition. It will be understood, however, that the techniques incorporated herein by reference for growing both beta and alpha silicon carbide thin films on silicon carbide substrates will produce thin films which also can be appropriately formed into diodes according to the present invention.

Following epitaxial growth, each sample was mechanically polished, oxidized, and etched in hydrofluoric acid (HF) to obtain a clean, undamaged and smooth surface prior to implantation. After mounting in high vacuum, the samples were heated to 823K and implanted with nitrogen (N) and aluminum (Al) in p-type (approximately $1 \times 10^{17} cm^{-3}$) and n-type (approximately $10^{16} cm^{-3}$) beta silicon carbide respectively to form the junctions. Nitrogen was implanted at dosages of 0.9 and $1.3 \times 10^{14} cm^{-2}$ and 90 and 180 keV, respectively. Aluminum was implanted at $4.8 \times 10^{14} cm^{-2}$ and 100 keV. The implants were made at an incident angle of 7° off normal to avoid channeling effects. Following implantation, each sample was annealed at 1473K for 30 minutes in dry oxygen followed by the same temperature and time in argon, and then finally etched in HF. As stated above, this procedure provided a means of structurally healing the implanted region and activating the dopant while removing the conductive, silicon rich, near surface region resulting from implantation.

The mesa structure diodes were fabricated on both nitrogen and aluminum implanted beta silicon carbide respectively. In one embodiment, the mesa structures were formed with an area of $3.14 \times 10^{-4} cm^2$ by reactive ion etching with nitrogen trifluoride (NF$_3$) gas using aluminum as a mask. The ohmic contacts for p and n-type material were Al and TaSi$_2$ respectively. In order to characterize the diodes, current voltage measurements between 300K and 673K and room temperature capacitance-voltage measurements were performed.

Figure 3:
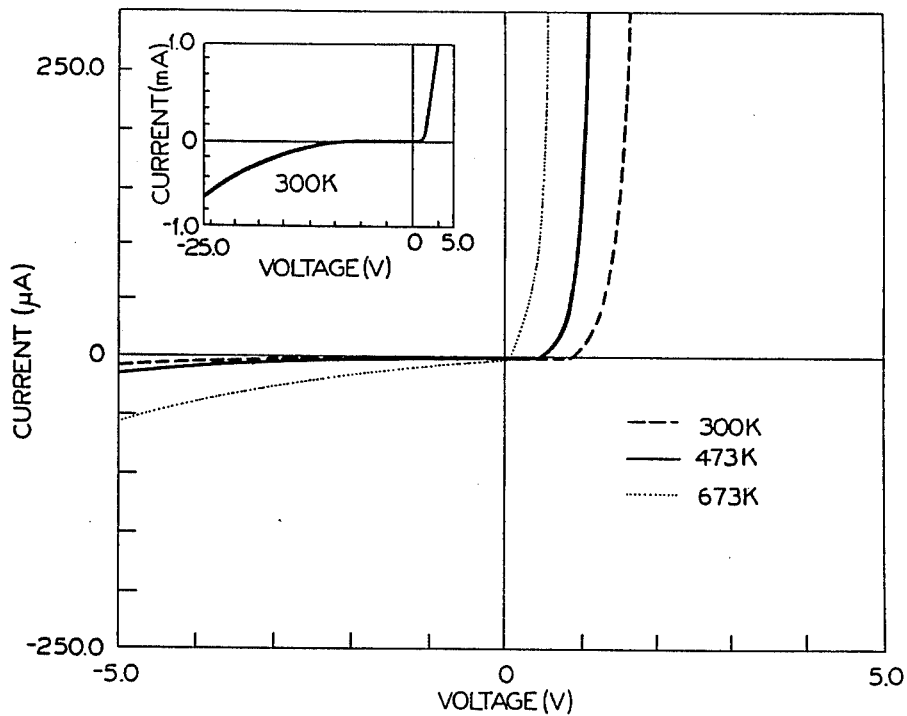
FIG. 3 is a plot of current versus voltage for an n-implanted junction diode in beta silicon carbide as a function of temperature.

FIG. 3 illustrates a typical linear current versus voltage plot of the nitrogen implanted mesa diodes as a function of temperature. FIG. 3 shows that the diodes are clearly rectifying with relatively low leakage current. At a reverse bias of 5 volts, the room temperature leakage current was approximately 5 microamps. The room temperature reverse current increased moderately with increasing bias as shown in the inset in FIG. 3. At the highest measurement temperature, the leakage current increased to approximately 50 microamps at −5 volts.

In the forward bias, a turn-on voltage of approximately 1 volt was observed at 300K which reduced to essentially 0 volts at 673K.

In addition to the current versus voltage measurements, capacitance-voltage measurements at room temperature were performed on the nitrogen implanted mesa diode of FIG. 3.

Figure 4:
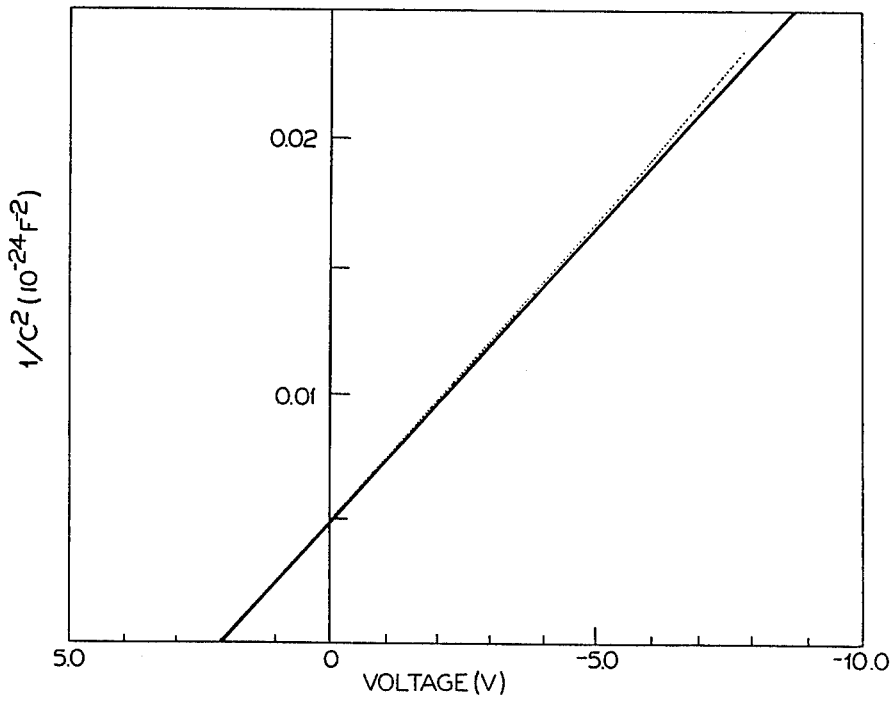
FIG. 4 is a plot of the reciprocal of capacitance squared versus voltage for the diode shown in FIG. 1.

FIG. 4 is a plot of the reciprocal of capacitance squared versus voltage where a maximum of −7.5 volts was applied. A linear relationship between these two parameters was maintained to a voltage of −5 volts, indicating an abrupt junction. For this diode, the electron density on the n-side at equilibrium was approximately $4 \times 10^{18} cm^{-3}$ and the hole density on the p side was approximately $1 \times 10^{17} cm^{-3}$.

Figure 5:
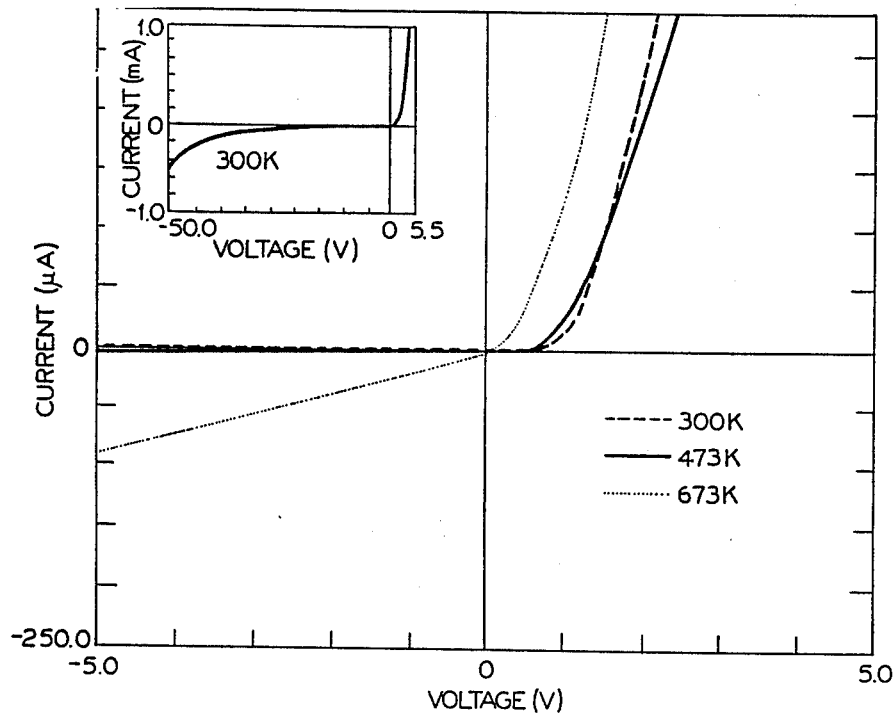
FIG. 5 is a plot of current versus voltage for an Al-implanted junction diode in beta silicon carbide as a function of temperature.

FIG. 5 illustrates the current voltage characteristics for a diode formed by implanting aluminum, i.e. p-type characteristics, into an n-type beta silicon carbide substrate. As seen in FIG. 5, the leakage current at 300K was approximately 0.3 microamps at −5 volts. This increased to 500 microamps at −50 volts as shown in the FIG. inset. At 673K, the leakage current increased only slightly to 85 microamps at −5 volts. At room temperature, the forward bias portion of the curve turned on at approximately 0.8 volts. An increase in temperature reduced the turn-on voltage. From the forward current results, however, it appears that the resistance of the device increased between 300K and 473K, decreasing again at 673K. This effect was not observed for the n-implanted diode.

Figure 6:
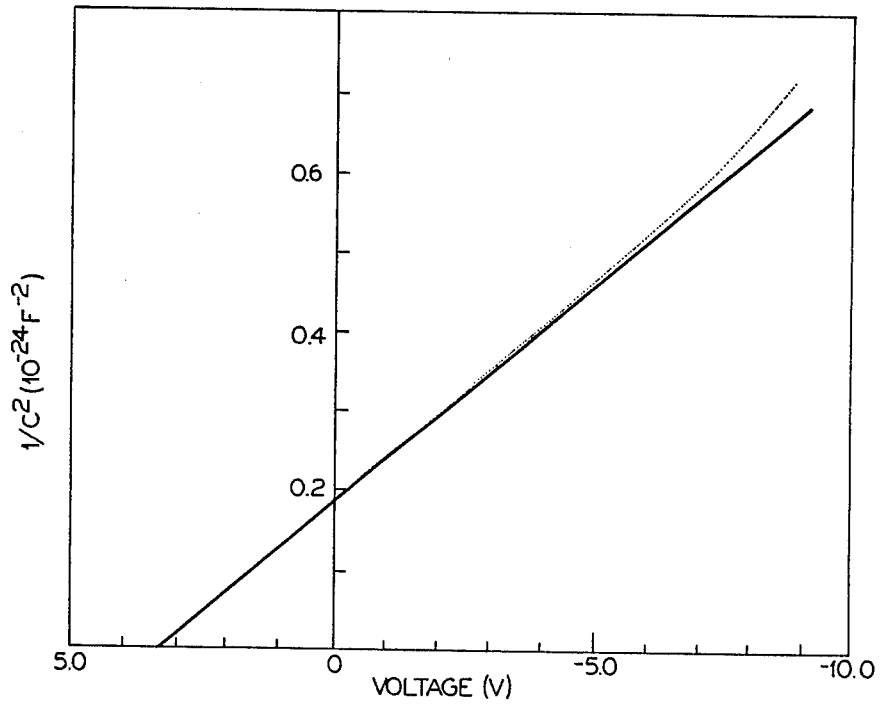
FIG. 6 is a plot of the inverse of capacitance squared versus voltage for the diode shown in FIG. 6.

FIG. 6 shows the results of the capacitance-voltage measurements (again plotted as 1/C$^2$ versus V) performed on the aluminum implanted diodes. The capacitance values obtained were quite low, in the range of no more than about 2.5 picofarads (pF). FIG. 10 demonstrates that for this diode a linear relationship up to approximately −5 volts resulted. This indicates that the junction is abrupt.

In summary, the current voltage characteristics of both nitrogen implanted and aluminum implanted junction diodes fabricated in beta silicon carbide showed rectification up to a temperature of 673K. Capacitance voltage measurements indicated both types of diodes were abrupt junctions. Both planar and mesa diodes can be formed according to the present invention using the novel high temperature ion implantation techniques discussed herein and incorporated by reference. Furthermore, both p and n-type regions and resulting successful junctions could be formed in silicon carbide according to the present invention.

In the description and drawings, there have been set forth preferred and exemplary embodiments of the invention, which have been included by way of example and not by way of limitation, the scope of the invention being set forth in the accompanying claims.

That which is claimed is:

1. A planar diode suitable for operation under conditions of higher temperatures, higher power levels, and under higher radiation density than diodes formed from other semiconductor materials and comprising:

a doped silicon carbide substrate having a first conductivity type;

a doped well of silicon carbide within said substrate having the opposite conductivity type from said doped silicon carbide substrate, said doped well forming a p-n junction with said substrate, with portions of said p-n junction being adjacent the surface of said substrate;

an insulation layer on said surface of said silicon carbide substrate and positioned over said p-n junction at said surface;

an ohmic contact upon said substrate;

an ohmic contact upon said well; and a conductor separate from either of said ohmic contacts and positioned upon the insulation layer directly above the p-n junction for permitting a separate potential to be applied directly to said portions of the p-n junction adjacent said surface of said substrate to thereby prevent the depletion zone adjacent the well from substantially expanding in a direction parallel to the surface of the diode.

2. A planar diode according to claim 1 wherein said substrate is formed of alpha silicon carbide.

3. A planar diode according to claim 1 wherein said substrate is formed of beta silicon carbide.

4. A planar diode according to claim 1 wherein said substrate is formed of n-type silicon carbide and said well is formed of p-type silicon carbide.

5. A planar diode according to claim 1 wherein said substrate is formed of p-type silicon carbide and said well is formed of n-type silicon carbide.

6. A planar diode according to claim 1 wherein said ohmic contact to said substrate comprises tantalum silicide and said ohmic contact to said well comprises aluminum.

7. A planar diode according to claim 1 wherein said ohmic contact to said substrate comprises aluminum and said ohmic contact to said well comprises tantalum silicide.

8. A planar diode according to claim 1 wherein said insulation layer comprises silicon dioxide.

* * * * *

UNITED STATES PATENT AND TRADEMARK OFFICE
CERTIFICATE OF CORRECTION

PATENT NO. : 4,947,218

DATED : August 7, 1990

INVENTOR(S) : John A. Edmond and Robert F. Davis

It is certified that error appears in the above-identified patent and that said Letters Patent is hereby corrected as shown below:

Column 1, line 59, delete "c,912,063" and insert --4,912,063--.

Signed and Sealed this

Ninth Day of June, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 4,947,218
DATED : July 31, 1990
INVENTOR(S) : John A. Edmond and Robert F. Davis It is certified that error appears in the above-identified patent and that said Letters Patent is hereby corrected as shown below:

<u>Column 1,</u>
Line 2, insert the following:
-- The U.S. Government has a paid-up license in this invention and the right in limited circumstances to require the patent owner to license others on reasonable terms as provided for by the terms of contract N00014-82-K-0182 awarded by the Office of Naval Research. --

Signed and Sealed this

Twenty-sixth Day of April, 2005

JON W. DUDAS
*Director of the United States Patent and Trademark Office*